(12) United States Patent
Kim

(10) Patent No.: US 11,109,483 B2
(45) Date of Patent: Aug. 31, 2021

(54) CIRCUIT BOARD AND ELECTRONIC DEVICE INCLUDING SAME

(71) Applicant: SAMSUNG ELECTRONICS CO., LTD., Suwon-si (KR)

(72) Inventor: Shinho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/770,341

(22) PCT Filed: Dec. 3, 2018

(86) PCT No.: PCT/KR2018/015185
§ 371 (c)(1),
(2) Date: Jun. 5, 2020

(87) PCT Pub. No.: WO2019/112270
PCT Pub. Date: Jun. 13, 2019

(65) Prior Publication Data
US 2020/0367362 A1 Nov. 19, 2020

(30) Foreign Application Priority Data
Dec. 6, 2017 (KR) .................. 10-2017-0166907

(51) Int. Cl.
*H05K 1/16* (2006.01)
*H01F 27/28* (2006.01)
*H05K 1/11* (2006.01)
*H05K 7/14* (2006.01)

(52) U.S. Cl.
CPC ......... *H05K 1/165* (2013.01); *H01F 27/2804* (2013.01); *H05K 1/115* (2013.01); *H05K 7/1427* (2013.01)

(58) Field of Classification Search
CPC .......... H05K 1/165; H05K 1/16; H05K 1/115; H05K 7/1427; H01F 27/2804
USPC ........................................... 174/250
See application file for complete search history.

(56) References Cited

U.S. PATENT DOCUMENTS 3,757,028 A * 9/1973 Schlessel ............. H05K 9/0039
174/33
5,006,788 A 4/1991 Goulette et al.
5,978,231 A 11/1999 Tohya et al.
(Continued)

FOREIGN PATENT DOCUMENTS

JP 2016-134809 7/2016
KR 10-1998-0087247 12/1998

OTHER PUBLICATIONS

International Search Report for PCT/KR2018/015185 dated Mar. 15, 2019, 5 pages.
(Continued)

*Primary Examiner* — Sherman Ng
(74) *Attorney, Agent, or Firm* — Nixon & Vanderhye, P.C.

(57) ABSTRACT

An example circuit board includes a plurality of dielectric layers having a plurality of pattern holes; and a plurality of transmission lines formed in the plurality of dielectric layers, and coupled according to the plurality of pattern holes so as to form a plurality of patterns, wherein, when a current is applied to each of the plurality of transmission lines, magnetic flux can be generated in the plurality of patterns.

12 Claims, 11 Drawing Sheets

(56) References Cited

U.S. PATENT DOCUMENTS

| | | | |
|---|---|---|---|
| 6,215,076 B1* | 4/2001 | Inagawa | H05K 1/0216 |
| | | | 174/250 |
| 2002/0121943 A1 | 9/2002 | Axelrod et al. | |
| 2003/0112615 A1* | 6/2003 | Stoddard | H05K 1/0233 |
| | | | 361/777 |
| 2004/0039859 A1 | 2/2004 | He et al. | |
| 2011/0037556 A1* | 2/2011 | Pai | H01F 17/0013 |
| | | | 336/200 |
| 2012/0306609 A1 | 12/2012 | Kato | |
| 2013/0215587 A1 | 8/2013 | Kawai | |
| 2016/0210615 A1* | 7/2016 | Lee | G06K 7/10356 |
| 2016/0211563 A1 | 7/2016 | Morita et al. | |
| 2016/0344181 A1 | 11/2016 | Matsunaga | |
| 2017/0194931 A1 | 7/2017 | Xu | |
| 2018/0310408 A1* | 10/2018 | Hamada | H05K 1/18 |

OTHER PUBLICATIONS

Written Opinion of the ISA for PCT/KR2018/015185 dated Mar. 15, 2019, 5 pages.

* cited by examiner

US 11,109,483 B2

CIRCUIT BOARD AND ELECTRONIC DEVICE INCLUDING SAME

CROSS-REFERENCE TO RELATED APPLICATION(S)

This application is a National Phase Entry of PCT International Application No. PCT/KR2018/015185, which was filed on Dec. 3, 2018 and claims priority to Korean Patent Application No. 10-2017-0166907, which was filed on Dec. 6, 2017, the contents of which are incorporated herein by reference.

BACKGROUND

1. Field

Various embodiments of the disclosure relate to a circuit board including a power transmission line that interrupts external noise and an electronic device including the same.

2. Description of the Related Art

Various types of electronic devices have been developed and distributed thanks to the development of the electronic technologies. For example, portable electronic devices such as smartphones, notebook computers, tablet PCs, and wearable devices have been increasingly distributed.

Methods of transmitting data of a display screen or receiving image data in a camera sensor by a portable electronic device may include a camera serial interface (hereinafter, referred to as a CSI) of the standard of mobile industry processor interface (hereinafter, referred to as an MIPI) and a display serial interface (hereinafter, referred to as a DSI) for communication with an image display device.

In the high speed serial interfaces such as the DSI and CSI, basically, data is transmitted through a signal power transmission line of a differential mode.

The signal power transmission line of the differential mode includes a common mode filter (hereinafter, referred to as a CMF) to interrupt noise (e.g., electro-magnetic interference (EMI) and electrostatic discharge (ESD)) introduced from the outside.

SUMMARY

When the conventional differential mode signal power transmission line includes a common mode filter to interrupt external noise, the area and the thickness of the portable electronic device may be increased and manufacturing costs may be increased.

Various embodiments of the disclosure provides a circuit board formed with at least one power transmission line, in which a pattern for interrupting external nose is formed, and an electronic device including the same.

According to various embodiments, a circuit board may include a plurality of dielectric layers having a plurality of pattern holes, and a plurality of power transmission lines formed in the plurality of dielectric layers, and coupled along the plurality of pattern holes to form a plurality of patterns, and magnetic fluxes may be generated in the plurality of patterns when a current is applied to each of the plurality of power transmission lines.

According to various embodiments, the plurality of dielectric layers may be disposed to be stacked and have a plurality of first pattern holes and a plurality of second pattern holes, the plurality of power transmission lines may include a first transmission line formed in the plurality of dielectric layers, and coupled along the plurality of first pattern holes to form a plurality of first patterns, and a second transmission line formed in the plurality of dielectric layers, and coupled along the plurality of second pattern holes to form a plurality of second patterns, and the magnetic fluxes may be generated in the plurality of first and second patterns when the current is applied to each of the plurality of first and second power transmission lines.

According to various embodiments, an electronic device including a circuit board may include a housing including a first surface, a second surface facing an opposite direction of the first surface, and side surfaces surrounding a space between the first surface and the second surface, and a circuit board disposed in the interior of the housing, and the circuit board may include a plurality of dielectric layers disposed to be stacked and having a plurality of first pattern holes and a plurality of second pattern holes, a plurality of first transmission lines formed in the plurality of dielectric layers, and coupled along the plurality of first pattern holes to form a plurality of first patterns, and a plurality of second transmission lines formed in the plurality of dielectric layers, and coupled along the plurality of second pattern holes to form a plurality of second patterns, and magnetic fluxes may be generated in the plurality of first and second patterns when a current is applied to each of the plurality of first and second power transmission lines According to various embodiments of the disclosure, because at least one power transmission line that forms patterns that form magnetic fluxes in a circuit board is provided, external noise can be interrupted by using the magnetic fluxes generated in the patterns, and thus external noise (e.g., electro-magnetic interference (EMI) or electrostatic discharge (ESD)) can be interrupted. Further, because an existing common mode filter provided in a portable communication device to interrupt external noise is not necessary, the area and the thickness of the product can be reduced, the product can be made smaller and slimmer, and the manufacturing costs of the product can be reduced.

DETAILED DESCRIPTION

Figure 1:
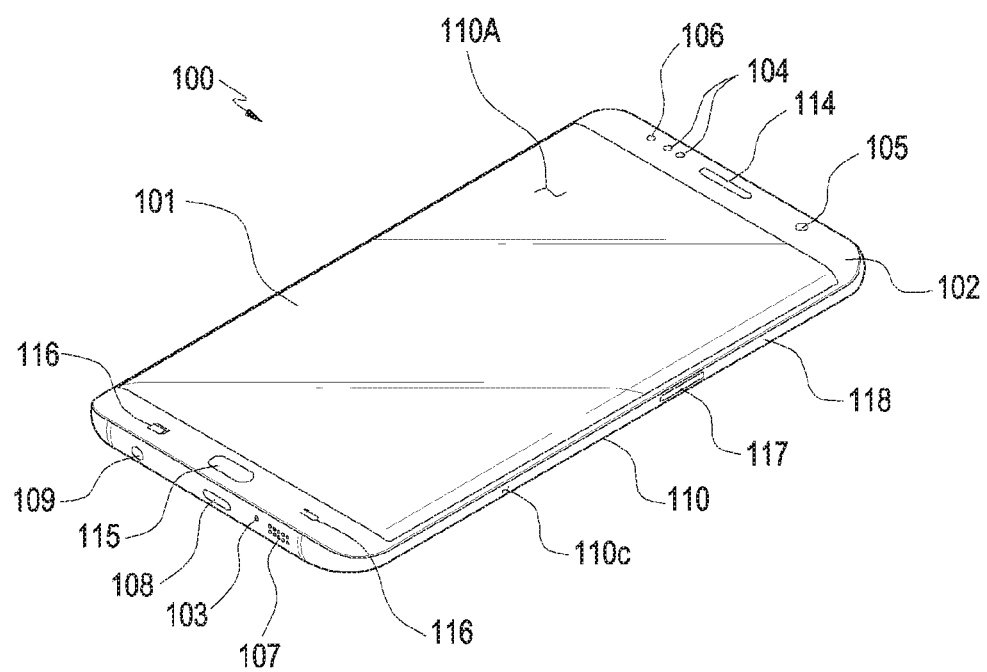
FIG. 1 is a front perspective view of an electronic device according to various embodiment of the disclosure.

Hereinafter, the electronic device according to various embodiments may be various types of electronic devices. The electronic devices may include, for example, at least one of a portable communication device (e.g., a smart phone), a computer device, a portable multimedia device, a portable medical device, a camera, a wearable device, or a home appliance. The electronic devices according to an embodiment are not limited to those described above.

It should be appreciated that various embodiments and the terms used therein are not intended to limit the technological features set forth herein to particular embodiments and include various changes, equivalents, or replacements for a corresponding embodiment. With regard to the description of the drawings, similar reference numerals may be used to refer to similar elements. Singular expressions may include plural expressions, unless the context clearly indicates otherwise. As used herein, each of such phrases as "A or B," "at least one of A and B," "at least one of A or B," "A, B, or C," "at least one of A, B, and C," or "at least one of A, B, or C," may include all possible combinations of the items enumerated together in a corresponding one of the phrases. Expressions such as "first," "second," "primarily," or "secondary," used herein may modify corresponding elements regardless of order or importance, are used to only distinguish one element from another and do not limit corresponding elements. When it is described that an element (e.g., a first element) is "(operatively or communicatively) coupled with/to" or "connected" to another element (e.g., a second element), the element can be directly connected to the other element or can be connected to the other element through another element (e.g., a third element).

A term "module" used herein may mean, for example, a unit including hardware, software, or firmware, and may be used interchangeably with terms such as logic, a logic block, a part, or a circuit. The module may be a single integral component, or a minimum unit or part thereof, adapted to perform one or more functions. For example, the module may be implemented as an application-specific integrated circuit (ASIC).

Figure 2:
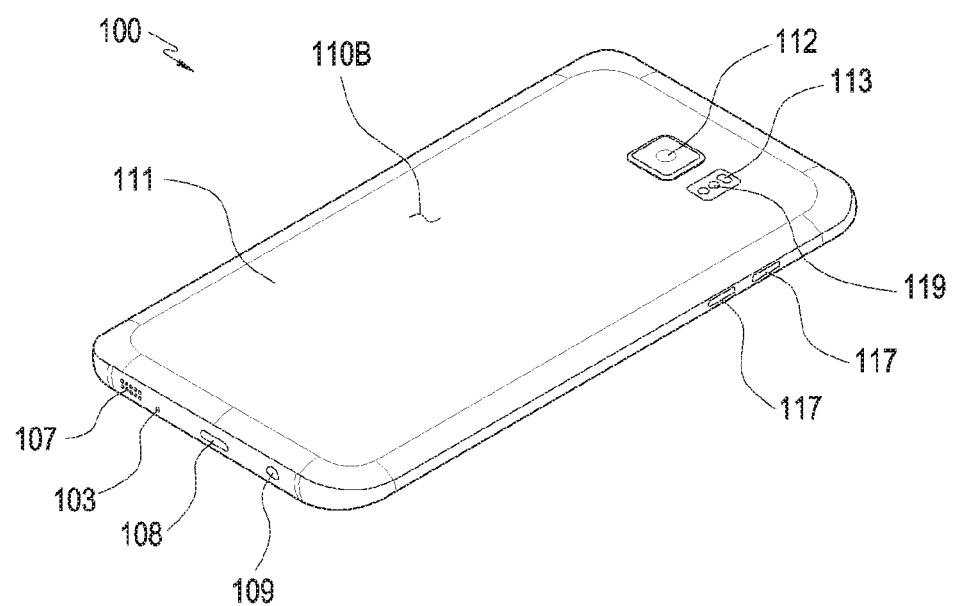
FIG. 2 is a rear perspective view of the electronic device of FIG. 1.

Referring to FIGS. 1 and 2, an electronic device 100 according to an embodiment may include a housing 110 including a first surface (or a front surface) 110A, a second surface (or a rear surface) 110B, and a side surface 110C that surrounds a space between the first surface 110A and the second surface 110B. In another embodiment (not illustrated), the housing may refer to a structure that defines some of the first surface 110A, the second surface 110B, and the side surface 110C of FIG. 1. According to an embodiment, the first surface 110A may be formed by a front plate 102 (e.g., a glass plate or a polymer plate including various coating layers), at least a portion of which is substantially transparent. The second surface 110B may be formed by a rear plate 111 that is substantially opaque. The rear plate 111, for example, may be formed of coated or colored glass, ceramics, a polymer, a metal (e.g., aluminum, stainless steel (STS), or magnesium), or a combination of at least two thereof. The side surface 110C is coupled to the front plate 102 and the rear plate 111, and may be formed by a side bezel structure (or 'a side member') 118 including a metal and/or a polymer. In some embodiments, the rear plate 111 and the side bezel structure 118 may be integrally formed and may include the same material (e.g., a metallic material such as aluminum).

According to an embodiment, the electronic device 100 may include at least one of a display 101, audio modules 103, 107, 114, sensor modules 104 and 119, camera modules 105, 112, and 113, a key input device 115, 116, and 117, an indicator 106, and connector holes 108 and 109. In some embodiments, at least one (e.g., the key input device 115, 116, and 117 or the indicator 106) of the elements may be omitted from the electronic device 100 or another component may be additionally included in the electronic device 100.

The display 101, for example, may be exposed through a corresponding portion of the front plate 102. The display 101 may be coupled to or be disposed to be adjacent to a touch detection circuit, a pressure sensor that may measure the strength (the pressure) of a touch, and/or a digitizer that detects a stylus pen of a magnetic field type.

The audio modules 103, 107, 114 may include a microphone hole 103 and speaker holes 107 and 114. A microphone for acquiring external sounds may be disposed in the microphone hole 103, and in some embodiments, a plurality of microphones may be disposed to detect the direction of a sound. The speaker holes 107 and 114 may include an external speaker hole 107 and a communication receiver hole 114. In some embodiments, the speaker hole 107 and 114 and the microphone hole 103 may be realized by one hole or a speaker may be included while a speaker hole 107 and 114 is not employed (e.g., a piezoelectric speaker).

The sensor modules 104 and 119 may generate an electrical signal or a data value corresponding to an operational state of the interior of the electronic device 100 or an environmental state of the outside. The sensor modules 104 and 119, for example, may include a first sensor module 104 (e.g., a proximity sensor) and/or a second sensor module (not illustrated) (e.g., a fingerprint sensor) disposed on the first surface 110A of the housing 110, and/or a third sensor module 119 (e.g., a HRM sensor) disposed on the second surface 110B of the housing 110. The fingerprint sensor may be disposed not only on the first surface 110A (e.g., a home key button 115) but also the second surface 110B of the housing 110. The electronic device 100 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor 104.

The camera modules 105, 112, and 113 may include a first camera device 105 disposed on the first surface 110A of the electronic device 100, and a second camera device 112 and/or a flash 113 disposed on the second surface 110B. The camera modules 105 and 112 may include one or a plurality of lenses, an image sensor, and/or an image signal processor. The flash 113, for example, may include a light emitting diode or a xenon lamp. In some embodiments, two or more lenses (a wide angle/telephoto lens), and image sensors may be disposed on one surface of the electronic device 100.

The key input devices 115, 116, and 117 may include a home key button 115 disposed on the first surface 110A of the housing 110, a touch pad 116 disposed around the home key button 115, and/or a side key button 117 disposed on the side surface 110C of the housing 110. In another embodiment, the electronic device 100 may not include some or all of the above-mentioned key input devices 115, 116, and 117, and the key input devices 115, 116, and 117 which are not included, may be realized in different forms, such as a soft key, on the display 101.

The indicator 106, for example, may be disposed on the first surface 110A of the housing 110. The indicator 106, for example, may provide state information on the electronic device 101 in the form of light, and may include an LED.

The collector holes 108 and 109 may include a first connector hole 108 that may accommodate a connector (e.g., a USB connector) for transmitting and receiving electric power and/or data to and from an external electronic device and/or a second connector hole (e.g., an earphone jack) 109 that may accommodate a connector for transmitting and receiving an audio signal to and from the external device.

Figure 3:
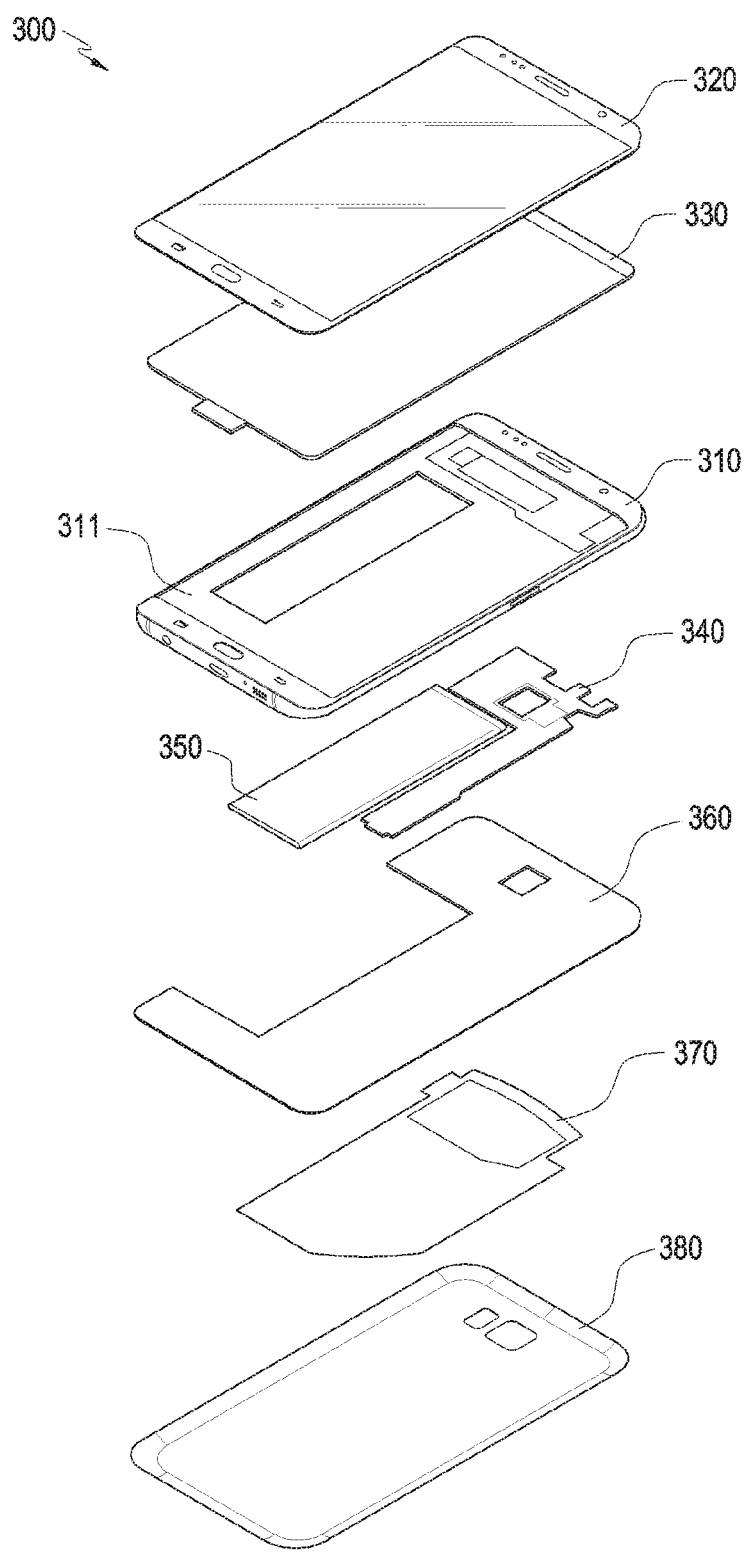
FIG. 3 is a deployed perspective view of the electronic device of FIG. 1.

Referring to FIG. 3, an electronic device 300 may include a side bezel structure 310, a first support member 311 (e.g., a bracket), a front plate 320, a display 330, a circuit board 340, a battery 350, a second support member 360 (e.g., a rear case), an antenna 370, and a rear plate 380. In some embodiments, at least one (e.g., the first support member 311 or the second support member 360) of the elements may be omitted from the electronic device 300 or another component may be additionally included in the electronic device 300. At least one of the components of the electronic device 300 may be the same as or similar to at least one of the components of the electronic device 100 of FIGS. 1 and 2, and a repeated description thereof will be omitted.

The first support member 311 may be disposed in the interior of the wearable electronic device 300 to be connected to the side bezel structure 310 or to be integrally formed with the side bezel structure 310. The first support member 311, for example, may be formed of a metallic material and/or a nonmetallic material (e.g., a polymer). The display 330 may be coupled to one surface of the first support member 311, and the printed circuit board 340 may be coupled to an opposite surface of the first support member 311. A processor, a memory, and/or an interface may be mounted on the circuit board 340. The processor, for example, may include one or more of a central processing unit, an application processor, a graphic processing unit, an image signal processor, a sensor hub processor, or a communication processor.

The memory, for example, may include a volatile or nonvolatile memory.

The interface, for example, may include a high definition multimedia interface (HDMI), a universal serial bus (USB), an SD card interface, and/or an audio interface. The interface, for example, may electrically or physically connect the electronic device 300 to an external electronic device, and may include a USB connector, an SD card/MMC connector, and an audio connector.

The battery 350 is a device for supplying electric power to at least one component of the electronic device 300, and for example, may include a primary battery that cannot be recharged, a secondary battery that may be recharged, or a fuel cell. At least a portion of the battery 350, for example, may be disposed on substantially the same plane as the printed circuit board 340. The battery 350 may be integrally disposed in the interior of the electronic device 100, and may be disposed to be detachable from the electronic device 100.

The antenna 370 may be disposed between the rear plate 380 and the battery 350. The antenna 370, for example, may include a near field communication (NFC) antenna, a wireless charging antenna, and/or a magnetic secure transmission (MST) antenna. The antenna 370, for example, may perform short-range communication with an external device, or may wirelessly transmit and receive electric power that is necessary for charging. In another embodiment, an antenna structure may be formed by one or a combination of the side bezel structure 310 and/or the first support member 311.

Various embodiments as set forth herein may be implemented as software (e.g., the program 140) including instructions that are stored in a storage medium (e.g., internal memory 136 or external memory 138) that is readable by a machine (e.g., computer). The machine may invoke stored instructions from the storage medium and operate according to the invoked instructions, and may include an electronic device (e.g., the electronic device 101) according to the disclosed embodiments. When the instructions are executed by a processor (e.g., the processor 120), the processor may perform functions corresponding to the instructions directly or by using other elements under the control of the processor. The instructions may include a code generated or executed by a compiler or an interpreter. The machine-readable storage medium may be provided in the form of a non-transitory storage medium. Wherein, the term "non-transitory" simply means that the storage medium is a tangible device, and does not include a signal, but this term does not differentiate between where data is semi-permanently stored in the storage medium and where the data is temporarily stored in the storage medium.

A method according to various embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed online via an application store (e.g., Play Store™). If distributed online, at least a part of the computer program product may be temporarily generated or at least temporarily stored in the machine-readable storage medium, such as memory of the manufacturer's server, a server of the application store, or a relay server.

Each of the components (e.g., a module or a program), according to various embodiments, may be configured as a single entity or a plurality of entities, and some of the sub-components described above may be omitted, or other sub-components may be further included in the various embodiments. Alternatively or additionally, some components (e.g., modules or programs) may be integrated into a single entity, and the integrated elements may still perform functions in the same or similar manner as they are performed by corresponding components before the integration. Operations performed by the module, the program, or another component according to various embodiments may be carried out sequentially, in parallel, repeatedly, or heuristically, or at least some operations may be executed in a different order or omitted, or other operations may be added.

Figure 4:
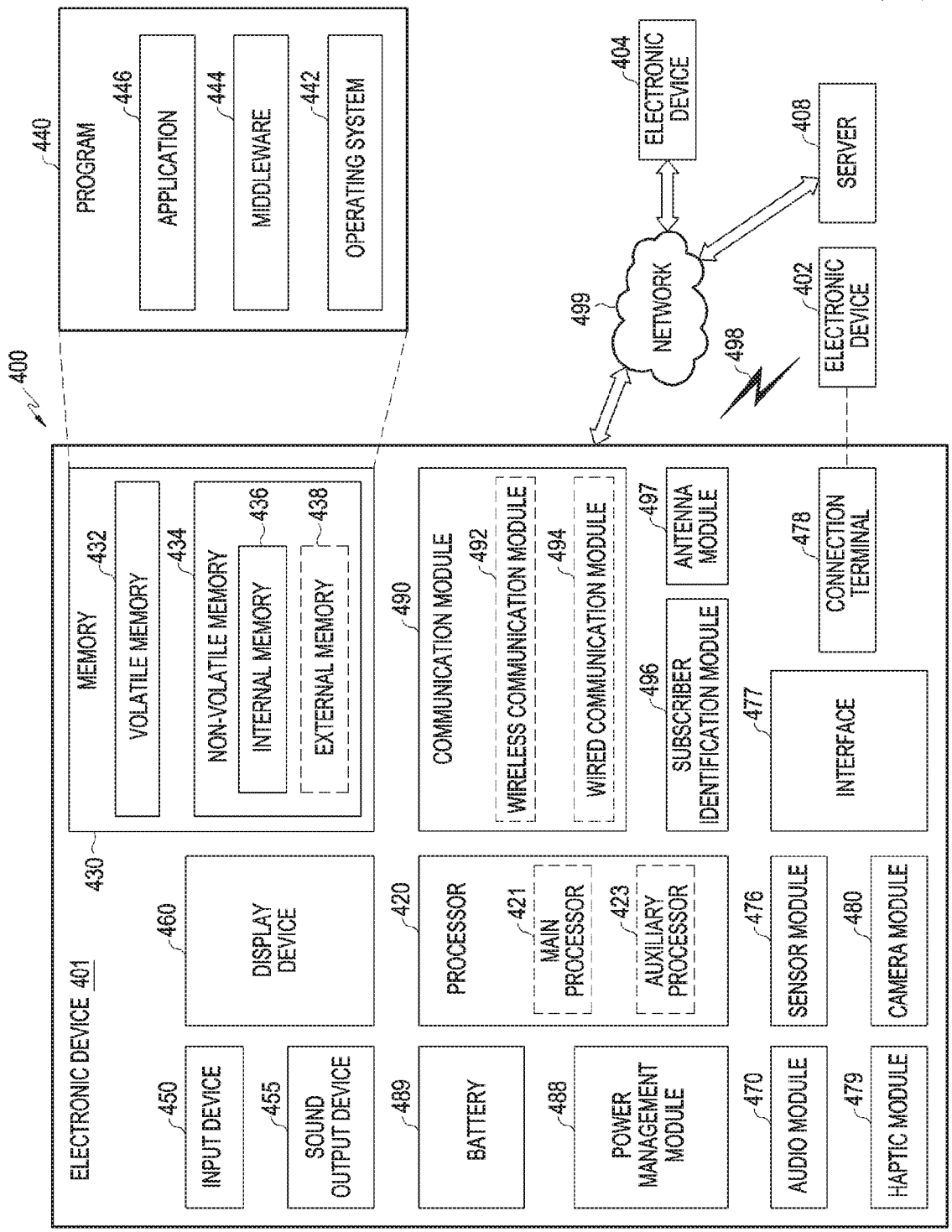
FIG. 4 is a block diagram illustrating a network environment including an electronic device according to various embodiments of the disclosure.

FIG. 4 is a block diagram illustrating an electronic device 401 in a network environment 400 according to various embodiments. Referring to FIG. 4, the electronic device 401 in the network environment 400 may communicate with an electronic device 402 via a fourth network 498 (e.g., a short-range wireless communication network), or an electronic device 404 or a server 408 via a second network 499 (e.g., a long-range wireless communication network). According to an embodiment, the electronic device 401 may communicate with the electronic device 401 via the server 408. According to an embodiment, the electronic device 401 may include a processor 420, memory 430, an input device 450, a sound output device 455, a display device 460, an audio module 470, a sensor module 476, an interface 477, a haptic module 479, a camera module 480, a power management module 488, a battery 489, a communication module 490, a subscriber identification module (SIM) 496, and an antenna module 497. In some embodiments, at least one (e.g., the display device 460 or the camera module 480) of the components may be omitted from the electronic device 401, or other components may be added in the electronic device 401. In some embodiment some components may be implemented to be integrated together, for example, as if the sensor module 476 (e.g., a fingerprint sensor, an iris sensor, or an illuminance sensor) is embedded in the display device 460 (e.g., a display).

The processor 420 may drive, for example, software (e.g., a program 440) to control at least one other component (e.g., a hardware or software component) of the electronic device 401 connected with the processor 420 and may process or compute various data. The processor 420 may load and process an instruction or data received from another component (e.g., the sensor module 476 or the communication module 490) on a volatile memory 432, and the processor 420 may store resultant data in a non-volatile memory 434. According to an embodiment, the processor 420 may include a main processor 421 (e.g., a central processing unit (CPU) or an application processor (AP)) and an auxiliary processor 423 that is operable independently from the main processor 421. In addition to, or instead of, the main processor 421, the processor 420 may include an auxiliary processor 423 (e.g., a graphics processing unit (GPU), an image signal processor, a sensor hub processor, or a communication processor) that consumes less power than the main processor 121 or is specified for a designated function. Here, the auxiliary processor 423 may be operated separately from or embedded in the main processor 421.

In such case, the auxiliary processor 423 may control, for example, at least some of functions or states related to at least one (e.g., the display device 460, the sensor module 476, or the communication module 490) of the components of the electronic device 401, instead of the main processor 421 while the main processor 421 is in an inactive (e.g., sleep) state or along with the main processor 421 while the main processor 421 is an active state (e.g., performing an application). According to an embodiment, the auxiliary processor 423 (e.g., an image signal processor or a communication processor) may be implemented as part of another component (e.g., the camera module 480 or the communication module 490) functionally related to the auxiliary processor 423. The memory 430 may store various data used by at least one component (e.g., the processor 420 or sensor module 476) of the electronic device 401, for example, software (e.g., the program 440) and input data or output data for an instruction related to the software. The memory 430 may include the volatile memory 432 or the non-volatile memory 434.

The program 440, as software stored in the memory 430, may include, for example, an operating system (OS) 442, middleware 444, or an application 446.

The input device 450 may be a device for receiving an instruction or data, which is to be used for a component (e.g., the processor 420) of the electronic device 401, from an outside (e.g., a user) of the electronic device 401. The input device 450 may include, for example, a microphone, a mouse, or a keyboard.

The sound output device 455 may be a device for outputting sound signals to the outside of the electronic device 401. The sound output device 455 may include, for example, a speaker which is used for general purposes, such as playing multimedia or recording and playing, and a receiver used for call receiving purposes only. According to an embodiment, the receiver may be formed integrally or separately from the speaker.

The display 460 may be a device for visually providing information to a user of the electronic device 401. The display device 460 may include, for example, a display, a hologram device, or a projector and a control circuit for controlling the display, hologram device, or projector. According to an embodiment, the display 460 may include a touch circuitry or a pressure sensor capable of measuring the strength of a pressure with respect to a touch.

The audio module 470 may convert a sound into an electrical signal and vice versa. According to an embodiment, the audio module 470 may obtain the sound via the input device 450, or output the sound via the sound output device 455 or an external electronic device (e.g., an electronic device 402 (e.g., a speaker or a headphone)) wiredly or wirelessly coupled with the electronic device 401.

The sensor module 476 may generate an electrical signal or data value corresponding to an internal operating state (e.g., power or temperature) or external environmental state of the electronic device 401. The sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a bio sensor, a temperature sensor, a humidity sensor, or an illuminance sensor.

The interface 477 may support a designated protocol enabling a wired or wireless connection with an external electronic device (e.g., the electronic device 402). According to an embodiment, the interface 477 may include a high definition multimedia interface (HDMI), a universal serial bus (USB) interface, a secure digital (SD) card interface, or an audio interface.

A connecting terminal 478 may include a connector, for example, an HDMI connector, a USB connector, an SD card connector, or an audio connector (e.g., a headphone connector), which is able to physically connect the electronic device 401 with an external electronic device (e.g., the electronic device 402).

The haptic module 479 may convert an electrical signal into a mechanical stimulus (e.g., a vibration or motion) or electrical stimulus which may be recognized by a user via his tactile sensation or kinesthetic sensation. The haptic module 479 may include, for example, a motor, a piezoelectric element, or an electric stimulator.

The camera module 480 may capture a still image or moving images. According to an embodiment, the camera module 480 may include one or more lenses, an image sensor, an image signal processor, or a flash.

The power management module 488 may be a module for managing power supplied to the electronic device 401. The power management module 488 may be configured as at least part of, for example, a power management integrated circuit (PMIC).

The battery 489 may be a device for supplying power to at least one component of the electronic device 401. The battery 489 may include, for example, a primary cell which is not rechargeable, a secondary cell which is rechargeable, or a fuel cell.

The communication module 490 may support establishing a wired or wireless communication channel between the electronic device 401 and an external electronic device (e.g., the electronic device 402, the electronic device 404, or the server 408) and performing communication through the established communication channel. The communication module 490 may include one or more communication processors that are operated independently from the processor 420 (e.g., an application processor) and supports wired or wireless communication. According to an embodiment, the communication module 490 may include a wireless communication module 492 (e.g., a cellular communication module, a short-range wireless communication module, or a global navigation satellite system (GNSS) communication module) or a wired communication module 494 (e.g., an local area network (LAN) communication module or a power-line communication module), and may communicate with the external electronic device using corresponding communication module via the fourth network 498 (e.g., a short-range communication network, such as Bluetooth™, wireless-fidelity (Wi-Fi) direct, or infrared data association (IrDA)) or the second network 499 (e.g., a long-range communication network, such as a cellular network, the Internet, or a computer network (e.g., an LAN or wide area network (WAN))). The above-enumerated types of communication modules 490 may be implemented in a single chip, or individually in separate chips.

According to an embodiment, the wireless communication module 492 may differentiate and authenticate the electronic device 401 in the communication network using user information stored in the subscriber identification module 496.

The antenna module 497 may include one or more antennas for transmitting or receiving a signal or power to/from an outside. According to an embodiment, the communication module 490 (e.g., the wireless communication module 492) may transmit or receive a signal to/from an external electronic device through an antenna appropriate for a communication scheme.

At least some of the above-described components may be coupled mutually and communicate signals (e.g., instructions or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 401 and the external electronic device 404 via the server 408 coupled with the second network 499. Each of the electronic device 402 and the electronic device 404 may be a device of the same type as or a different type than the electronic device 401. According to an embodiment, some or all of operations performed by the electronic device 401 may be performed in another electronic device or a plurality of other electronic devices. According to an embodiment, when the electronic device 401 has to perform a function or a service automatically or at a request, the electronic device 401 may request an external electronic device to perform at least some functions associated with the function or the service, instead of or in addition to executing the function or the service. The external electronic device having received the request may execute the requested function or additional function and deliver the execution result to the electronic device 401. The electronic device 401 may then process or further process the received result to provide the requested function or service. To that end, a cloud computing, distributed computing, or client-server computing technology may be used, for example.

According to various embodiments of the disclosure, the electronic device (e.g., 100 of FIG. 1) may include a housing (e.g., 110 of FIG. 1), and may include a circuit board (e.g., 500 of FIG. 5) disposed in the interior of the housing (e.g., 110 of FIG. 1). For example, the circuit board (e.g., 500 of FIG. 5) may include a processor (e.g., 420 of FIG. 4), and the electronic device (e.g., 100 of FIG. 1) may include a display, a sensor module (e.g., a fingerprint sensor or an iris recognition sensor), and a camera module. The components may be electrically connected to the processor (e.g., 420 of FIG. 4) by a pair of first power transmission lines (e.g., 502 and 503 of FIG. 5). For example, the pair of first and second power transmission lines (e.g., 520 and 530 of FIG. 5) may transmit a data signal of the display, an image data signal from a sensor of the camera module, and a biometric detection data signal of the sensor module to the processor (e.g., 420 of FIG. 4).

According to various embodiments of the disclosure, because the first and second patterns (e.g., 502a and 503a of FIG. 5) are included on the circuit board (e.g., 500 of FIG. 5) to replace a common mode filter provided to block external noise between the signal power transmission lines, they may interrupt external noise on the circuit board (e.g., 500 of FIG. 5) in place of the function of the existing common mode filter.

Figure 5:
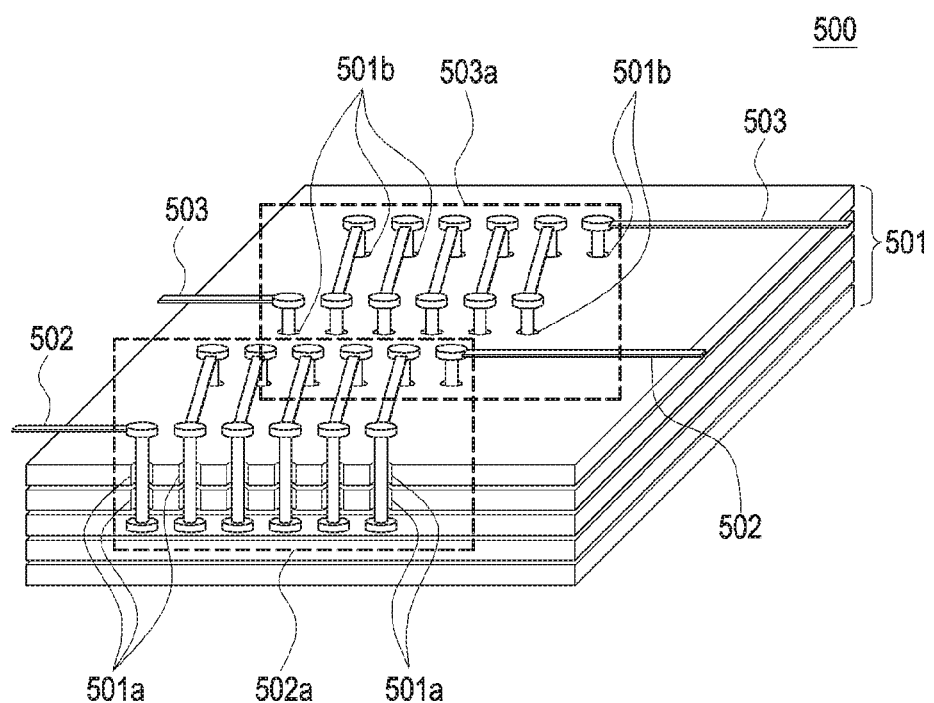
FIG. 5 is a perspective view illustrating a configuration of a circuit board according to various embodiments of the disclosure.

FIG. 5 is a perspective view illustrating a configuration of a circuit board 500 according to various embodiments of the disclosure. For example, the circuit board 500 may be denoted by 340 of FIG. 3.

Referring to FIG. 5, the circuit board 500 (e.g., 340 of FIG. 3) may include a plurality of dielectric layers 501 and a plurality of first and second power transmission lines 502 and 503. For example, the plurality of dielectric layers 501 may be layers formed of a dielectric material that shields electrical connection, and the dielectric layers 501 may be disposed to be stacked. A plurality of first and second pattern holes 501a and 501b, through which the plurality of first and second transmission lines 502 and 503, which will be described below, pass, may be disposed in the plurality of dielectric layers 501.

The plurality of first and second pattern holes 501a and 501b may include a plurality of via holes. Although it will be exemplified in the embodiment that the plurality of first and second pattern holes 501a and 501b are a plurality of via holes, the disclosure is not limited thereto. Any holes, through which the first and second power transmission lines 502 and 503 pass to form the first and second patterns (e.g., 502a and 503a of FIG. 5), may be variously applied as the plurality of first and second pattern holes 501a and 501b.

The plurality of first and second power transmission lines 502 and 503 may form the plurality of first and second patterns 502a and 503a while being coupled to be wound along the plurality of first and second pattern holes 501a and 501b. For example, the plurality of first and second patterns 502a and 503a may include coil-shaped patterns. The plurality of first and second patterns 502a and 503a may include patterns of various shapes, in addition to coil-shaped patterns.

When a current is applied to the plurality of first and second power transmission lines 502 and 503, magnetic fluxes may be generated in the plurality of first and second patterns 502a and 503a and also external noise may be interrupted by the magnetic fluxes. The external noise may include electro-magnetic interference (EMI) or electrostatic discharge (ESD). For example, the electro-magnetic interference (EMI) phenomenon refers to a phenomenon of generating noise in the electronic device and is applied to the human body as a harmful factor. For example, the electro-magnetic waves may be useful for radio communication or radar, but may negatively influence an operation of an electronic device. The electrostatic discharge (ESD) may greatly damage electronic component circuits included in the circuit board 500 when being introduced into the circuit board 500.

Accordingly, the circuit board 500 may include the plurality of first and second power transmission lines 502 and 503, in which the plurality of first and second patterns 502a and 503a that function as filters for interrupting the electromagnetic interference (EMI) or the electrostatic discharge (ESD) are disposed. Accordingly, damage to the electronic components embedded in the electronic device can be prevented.

The plurality of first and second patterns 502a and 503a may be used as filters that interrupt external noise by using the magnetic fluxes (e.g., B1 of FIG. 7) generated when first and second current (e.g., A1, A2 of FIG. 7) is applied. Accordingly, the circuit board 500 can interrupt noise that is introduced from the outside without using a common mode filter.

The plurality of first and second power transmission lines 502 and 503 may include differential mode signal power transmission lines.

Figure 6:
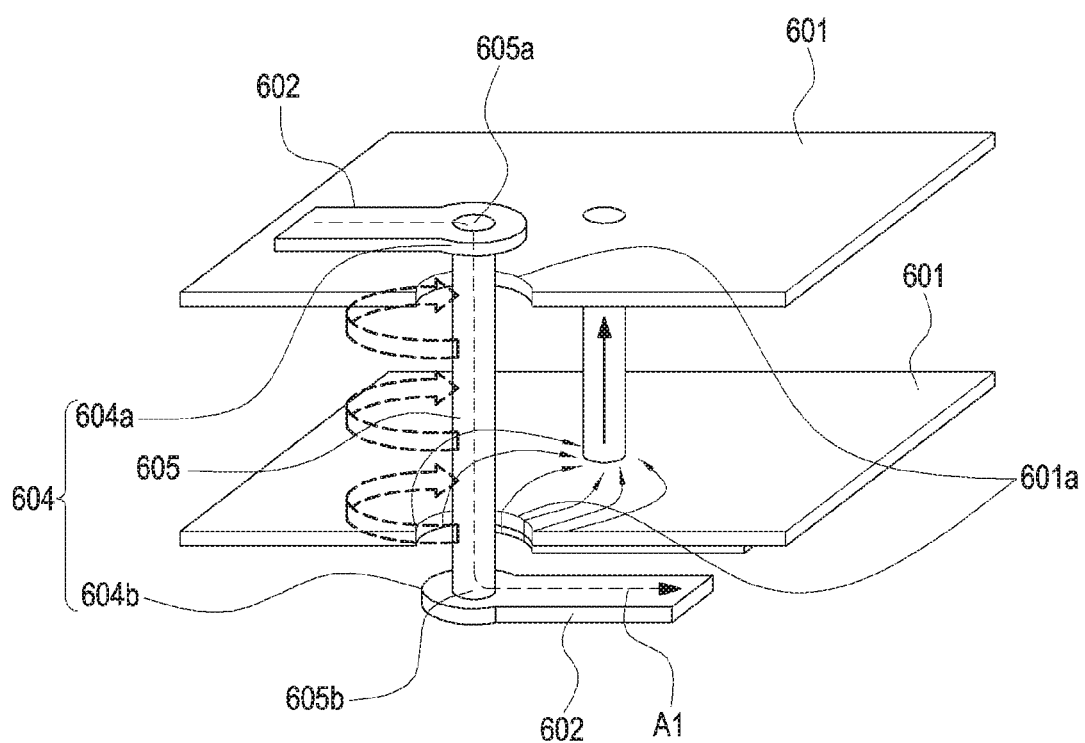
FIG. 6 is an enlarged perspective view illustrating a configuration of a circuit board according to various embodiments of the disclosure.

FIG. 6 is an enlarged perspective view illustrating a configuration of a circuit board (e.g., 500 of FIG. 5) according to various embodiments of the disclosure. For example, FIG. 6 may illustrate an enlarged perspective view of, among the plurality of first and second power transmission lines (e.g., 502 and 503 of FIG. 5) included in the circuit board (e.g., 500 of FIG. 5), the plurality of first power transmission lines (e.g., 502 of FIG. 5).

First, referring to FIG. 6, the plurality of first power transmission lines 602 (e.g., 502 of FIG. 5) may include a plurality of transmission varying parts 604 and a plurality of hole passing parts 605. For example, the plurality of transmission varying parts 604 may vary the direction of the first power transmission lines 602 from the horizontal direction to the vertical direction. The plurality of hole passing parts 605 may pass through the plurality of first pattern holes 601a, and may be included between the plurality of transmission varying parts 604.

According to an embodiment, the plurality of transmission varying parts 604 may include first and second transmission varying parts 604a and 604b. The first transmission varying parts 604a may be connected to first ends 605a of the plurality of hole passing parts 605, and the second transmission varying parts 604b may be connected to second ends 605b of the plurality of hole passing parts 605, which are opposite to the first ends 605a.

The first transmission varying parts 604a may be connected to the first power transmission lines 602 disposed between the plurality of dielectric layers 601 to vary the direction of the first power transmission lines 602 from the horizontal direction to the vertical direction. Then, the first transmission varying parts 604b may be connected to the first ends 605a of the plurality of hole passing parts 605. The first power transmission lines 602, the directions of which have been changed, may pass through the plurality of first pattern holes 601a. Because the plurality of hole passing parts 605, through which the plurality of first pattern holes 601a passes, are provided in the first power transmission lines 602, the first power transmission lines 602 may pass through the plurality of first pattern holes 601a through the plurality of hole passing parts 605.

The directions of the first power transmission lines 602 that passed through the hole passing parts 605 may be changed from the vertical direction to the horizontal direction by the second transmission varying parts 604b connected to second ends 605b of the plurality of hole passing parts 605.

In this way, the first power transmission lines 602 may be wound in a vertical direction or a horizontal direction by the first transmission varying parts 604 and the plurality of hole passing parts 605 to form a coil-shaped pattern, and the current A1 may flow and move along the first power transmission lines 602 of the coil-shaped pattern.

According to various embodiments of the disclosure, the second power transmission lines (e.g., 503 of FIG. 5) may include first transmission varying parts 604 and a plurality of hole passing parts 605 like the first power transmission lines 602, and the first transmission varying parts and the plurality of hole passing parts of the second power transmission lines (e.g., 503 of FIG. 5) are the same as the first transmission varying parts 604 and the plurality of hole passing parts 605 of the first power transmission lines 602, which have been described above, and thus a detailed description thereof will be omitted.

Figure 7:
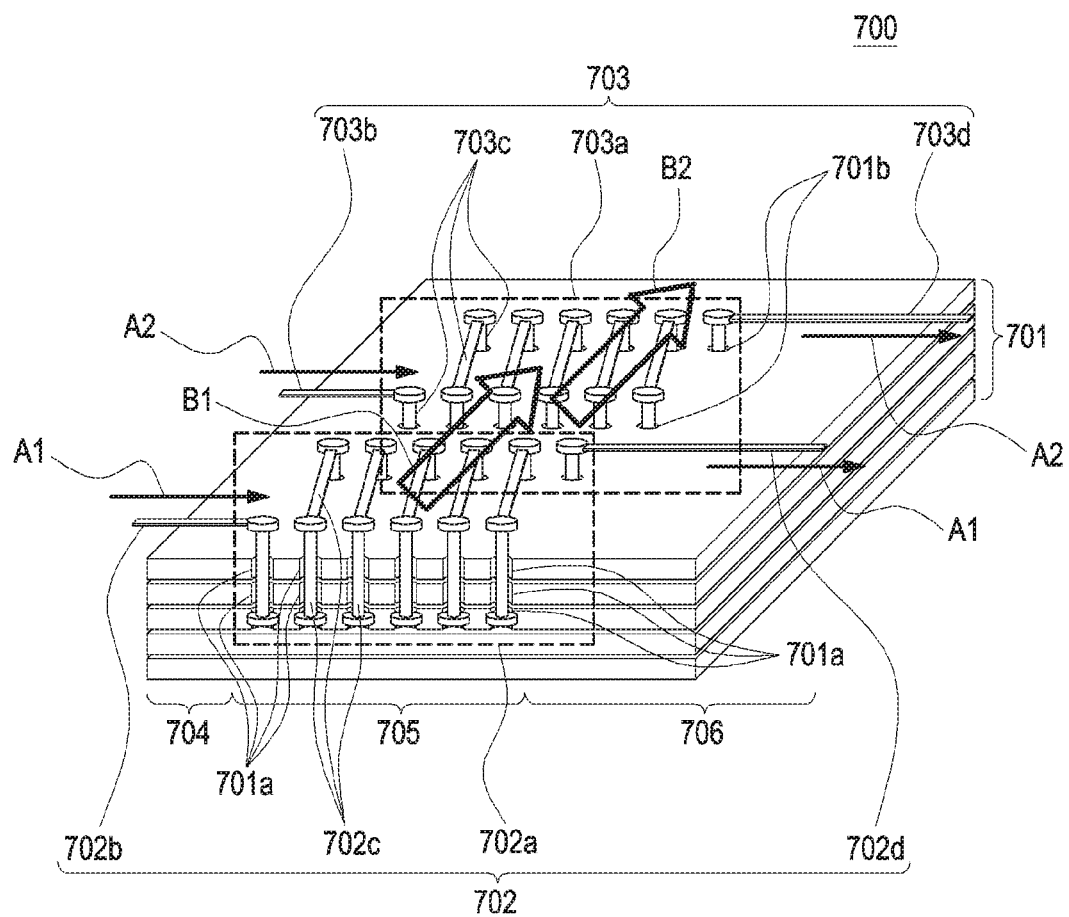
FIG. 7 is a perspective view illustrating an operational state of a circuit board according to various embodiments of the disclosure.

FIG. 7 is a perspective view illustrating an operational state of a circuit board 700 according to various embodiments of the disclosure.

Referring to FIG. 7, in the circuit board 700, the first and second power transmission lines 702 and 703 may be formed by seating a mask (not illustrated) on one end surface of the dielectric layer 701 and by using a mask (not illustrated). The dielectric layers 701 formed in this way may be disposed to be stacked, and the first and second power transmission lines 702 and 703 may be disposed between the dielectric layers 701. The first and second power transmission lines 702 and 703 may include a conductive member, and the dielectric layer 701 may include a dielectric material to shield the current between the first and second power transmission lines 702 and 703.

The plurality of dielectric layers 701 may have a plurality of first and second pattern holes 701a and 701b. For example, if the plurality of dielectric layers 701 is disposed to be stacked, the plurality of first pattern holes 701a and 701b may face each other and the plurality of second pattern holes 701a and 701b also may face each other. The first power transmission lines 702 may form the first pattern 702a while being coupled along the plurality of first pattern holes 701a, and the second power transmission lines 703 may form the second pattern 703a while being coupled along the plurality of second pattern holes 701b. The first and second power transmission lines 702 and 703 may form the coil-shaped patterns while being coupled to be wound along the plurality of first and second pattern holes 701a and 701b.

The first and second power transmission lines 702 and 703 may be disposed in the circuit board 700 in parallel at a predetermined interval while being wound in the same direction.

The first and second power transmission lines 702 and 703 may include first, second, and third transmission varying areas 704, 705, and 706. The first transmission area 704 may include an input part 702b, 703b for inputting the first and second current A1, A2, the second transmission area 706 may include an output part 702d, 703d for outputting the first and second current A1, A2, and the third transmission area 705 may include a flow part 702c, 703c for causing the current A1 to flow from the input part 702b, 703b to the output part 702d, 703d. The first and second patterns 702a and 703a may be disposed in the flow part 702c, 703c.

According to an embodiment, if the first and second current A1, A2 is applied to the input part 702b, 703b the current flows to the flow part 702c, 703c and the first and second current A1, A2 flows along the first and second patterns 702a and 703a of the flow part 702c, 703c. When the first and second current A1, A2 flows along the first and second patterns 702a and 703a, first and second magnetic fluxes B1, B2 may be generated in the first and second patterns 702a and 703a. Then, the first and second magnetic fluxes B1, B2 may be formed in a direction that is perpendicular to the first and second current A1, A2 input to the input part 702b, 703b. The first and second patterns 702a and 703a may generate the first and second magnetic fluxes B1, B2 in the same direction. The first and second current A1, A2 that passed through the first and second patterns 702a and 703a may flow to the output parts 702d and 703d and may be output to the outside.

According to an embodiment, the directions of the first and second magnetic fluxes B1, B2 may be explained through Fleming's left hand rule. For example, according to Fleming's left hand rule, if the thumb indicates the direction of an electromagnetic force and the index finger indicates the direction of a magnetic flux (magnetic field), the middle finger indicates the direction of a current. Here, because the angles between the fingers are right angles, the first and second magnetic fluxes B1, B2 may be perpendicular to the direction of the current.

In this way, if the first and second current A1, A2 is applied to the input parts 702b and 703b of the first and second power transmission lines 702 and 703, the first and second magnetic fluxes B1, B2 of the first and second patterns 702a and 703a may be formed in a direction that is perpendicular to the input direction of the first and second current A1, A2 and the formed first and second magnetic fluxes B1, B2 may interrupt external noise introduced into the first and second power transmission lines 702 and 703. Because the first and second magnetic fluxes B1, B2 are formed in the same vertical direction, the resistance is doubled, and accordingly, the external noise introduced into the first and second power transmission lines 702 and 703 can effectively interrupt the external noise. When the first and second current A1, A2 flows along the first and second patterns 702a and 703a, first and second magnetic fluxes B1, B2 may be generated in the first and second patterns 702a and 703a in the vertical direction. The first and second current A1, A2 that passed through the first and second patterns 702a and 703a may flow to the output parts 702d and 703d of the first and second power transmission lines 701 and 703 and may be output to the outside.

Accordingly, in various embodiments of the disclosure, because external noise can be interrupted by the first and second magnetic fluxes B1, B2 of the first and second patterns 702a and 703a formed in the circuit board 700, a common mode filter (CMF) separately provided to interrupt external noise is not necessary and thus the manufacturing costs of the product can be reduced.

Figure 8:
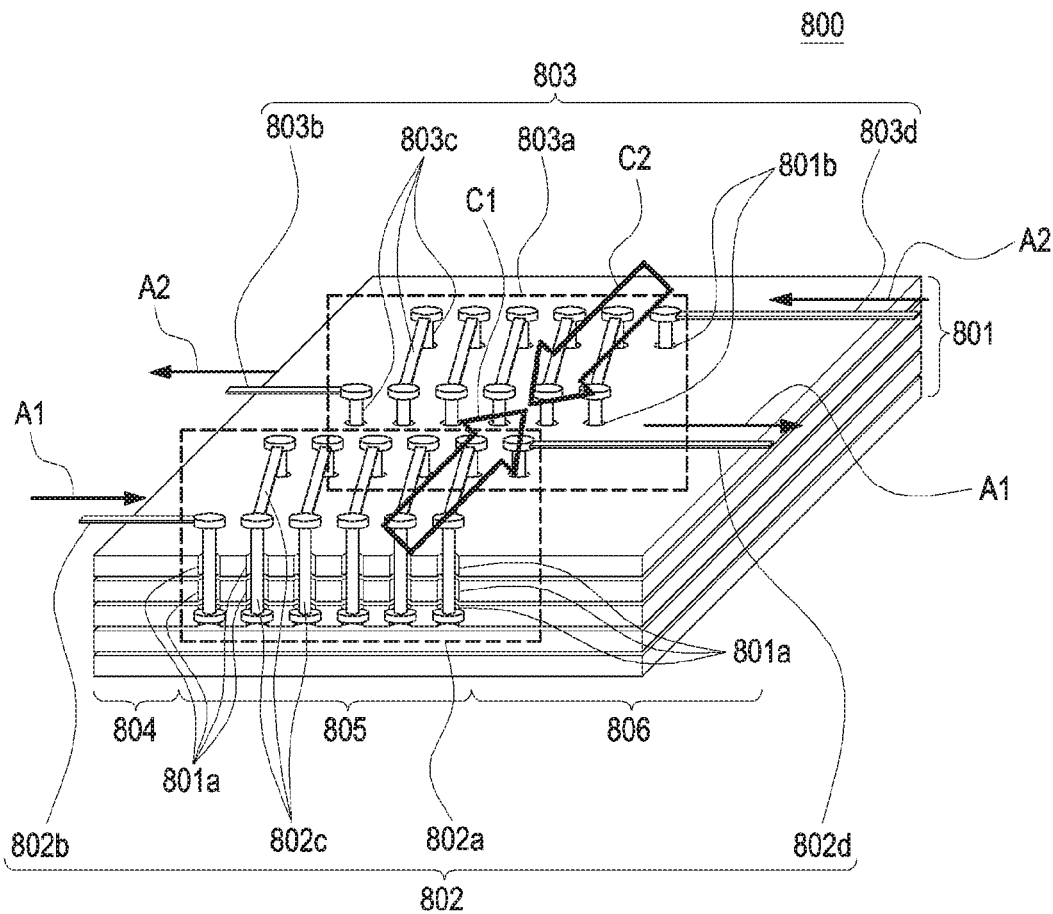
FIG. 8 is a perspective view illustrating another operational state of a circuit board according to various embodiments of the disclosure.

FIG. 8 is a perspective view illustrating another operational state of a circuit board 800 according to various embodiments of the disclosure.

Referring to FIG. 8, the circuit board 800 (e.g., 340 of FIG. 3) may include a plurality of dielectric layers 801 and first and second power transmission lines 802 and 803.

The plurality of dielectric layers 801 may have a plurality of first and second pattern holes 801a and 802b. For example, if the plurality of dielectric layers 801 is disposed to be stacked, the plurality of first pattern holes 801a and 802b may face each other and the plurality of second pattern holes 801a and 802b also may face each other. The first power transmission lines 802 may form the first pattern 802a while being coupled along the plurality of first pattern holes 801a and 802b, and the second power transmission lines 803 may form the second pattern 803a while being coupled along the plurality of second pattern holes 801a and 802b. The first and second power transmission lines 802 and 803 may form the coil-shaped patterns while being coupled to be wound along the plurality of first and second pattern holes 801a and 802b.

The first and second power transmission lines 802 and 803 may be disposed in the circuit board 800 in parallel at a predetermined interval while being wound in the same direction.

The first and second power transmission lines 802 and 803 may include first, second, and third transmission varying areas 804, 805, and 806. The first transmission area 804 may include an input part 802b, 803d for inputting first and second current A1, A2, the second transmission area 806 may include an output part 802d, 803b for outputting the first and second current A1, A2, and the third transmission area 805 may include a flow part 802c, 803c for causing the current A1 to flow from the input part 802b, 803d to the output part 802d, 803b. The first and second patterns 802a and 803a may be disposed in the flow part 802c, 803c.

According to an embodiment, if the first current A1 is applied to the input part 802b of the first power transmission line 802, the first current A1 flows to the flow part 802c of the first power transmission line 802 and the first current A1 flows along the first pattern 802a of the flow part 802c of the first power transmission line 802. When the first current A1 flows along the first pattern 802a, a first magnetic flux C1 may be generated in the first patterns 802a. Further, the first current A1 may flow to the output part 802d of the first power transmission line 802 and may be output to the outside.

Then, the first magnetic flux C1 may be formed in a vertical direction that is a first direction of the current input to the input part 802b of the first power transmission line 802.

According to an embodiment, if the second current A2 is applied to the input part 803d of the second power transmission line 803, the second current A2 flows to the flow part 803c of the second power transmission line 803 and the second current A2 flows along the second pattern 803a of the flow part 803c of the second power transmission line 803. When the second current A2 flows along the second pattern 803a, a second magnetic flux C2 may be generated in the second pattern 803a. Further, the second current A2 may flow to the output part 803b of the second power transmission line 803 and may be output. Then, the second magnetic flux C2 may be formed in a vertical direction that is a second direction of the second current A2 input to the output part 803d of the second power transmission line 803.

In this way, if the first current A1 is applied to the input part 802b of the first power transmission line 802, the first magnetic flux C1 is formed in the first direction, and to the contrary, if the second current A2 is applied to the output part 803d of the second transmission part 803, the second magnetic flux C2 may be formed in the second direction that is opposite to the first direction. For example, the first and second directions of the first and second magnetic fluxes C1 and C2 may be formed to be symmetrical to each other. Accordingly, because the first and second directions of the first and second magnetic fluxes C1 and C2 are symmetrically formed to face each other, the external noise introduced into the first and second power transmission lines 802 and 803 can be efficiently interrupted and the manufacturing costs of the product can be reduced as the common mode filter (CMF) separately provided to interrupt the external noise is not necessary.

Figure 9:
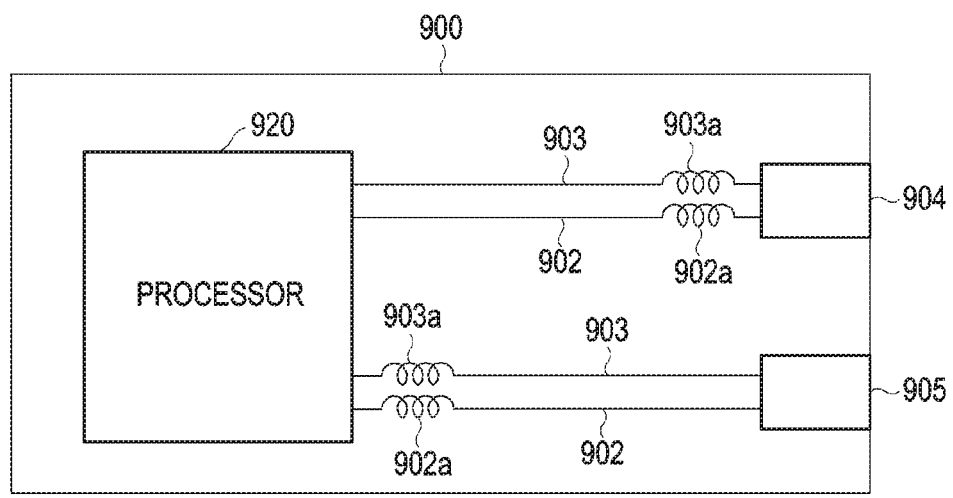
FIG. 9 is a view illustrating operational states of a processor and first and second power transmission lines included in a circuit board according to various embodiments of the disclosure.

FIG. 9 is a view illustrating operational states of a processor 920 and a plurality of first and second power transmission lines 902 and 903 included in a circuit board 900 according to various embodiments of the disclosure. For example, the circuit board 900 may be denoted by 500 of FIG. 5, the processor may be denoted by 420 of FIG. 4, and the plurality of first and second power transmission lines 902 and 903 may be denoted by 502 and 503 of FIG. 5.

Referring to FIG. 9, the circuit board 900 (e.g., 500 of FIG. 5) may include a processor 920 (e.g., 420 of FIG. 4). For example, the processor 920 (e.g., 420 of FIG. 4) may control at least one other element (e.g., a hardware or software element) of the electronic device (e.g., 401 of FIG. 4) connected to the processor 920 (e.g., 420 of FIG. 4) by driving software (e.g., the program (440 of FIG. 4)) and may perform various data processing and calculations. The processor 920 (e.g., 420 of FIG. 4) may load a command or data received from another component in a volatile memory (e.g., 432 of FIG. 4) and process the command or data, and may store the result data in a nonvolatile memory (e.g., 434 of FIG. 4).

The other component may include a display (e.g., 460 of FIG. 4) and a camera module (480 of FIG. 4). The other element may include another module other than the display and the camera module.

The circuit board 900 (e.g., 500 of FIG. 5) may include a display connector 904 and a camera connector 905 to electrically connect the display (e.g., 460 of FIG. 4) and the camera module (e.g., 480 of FIG. 4). For example, the circuit board 900 may include a plurality of power transmission lines electrically connected to the display connector 904 and the camera connector 905. The plurality of power transmission lines may include the plurality of first and second power transmission lines 902 and 903 (e.g., 502 and 503 of FIG. 5), and pairs of first and second power transmission lines 902 and 903 (e.g., 502 and 503 of FIG. 5) may be provided to transmit and receive signals. For example, the first and second power transmission lines 902 and 903 (e.g., 502 and 503 of FIG. 5) may include a pair of first power transmission lines 902 (e.g., 502 of FIG. 5) or a pair of second power transmission lines 903 (e.g., 503 of FIG. 5).

The pairs of first and second power transmission lines 902 and 903 (e.g., 502 and 503 of FIG. 5) may include first and second patterns 902a and 903a that generate magnetic fluxes when a current is applied, and the first and second patterns 902a and 903a can interrupt external noise with the magnetic fluxes. The first and second patterns 902a and 903a of the pair of first and second power transmission lines 902 and 903 (e.g., 502 and 503 of FIG. 5) may be disposed at a location that is adjacent to the display connector 904 electrically connected to the display (e.g., 460 of FIG. 4), and the first and second patterns 902a and 903a of the other pair of first and second power transmission lines 902 and 903 (e.g., 502 and 503 of FIG. 5) may be disposed at a location that is remote from the camera connector 905 electrically connected to the camera module (e.g., 480 of FIG. 4). For example, the first and second patterns 902a and 903a of the pair of first and second power transmission lines 902 and 903 (e.g., 502 and 503 of FIG. 5) connected to the display connector 904 may be disposed at a location that is adjacent to the display connector 904, and the first and second patterns 902a and 903a of the other pair of first and second power transmission lines 902 and 903 (e.g., 502 and 503 of FIG. 5) connected to the camera connector 905 may be disposed at a location that is adjacent to the processor 920 (e.g., 420 of FIG. 4) that is remote from the camera connector 905.

Accordingly, because the first and second patterns 902a and 903a of the pair of first and second power transmission lines 902 and 903 (e.g., 502 and 503 of FIG. 5) are disposed at a location that is adjacent to the display connector 904, an empty space around the display connector 904 may be utilized. Further, because the first and second patterns 902a and 903a of the other pair of first and second power transmission lines 902 and 903 (e.g., 502 and 503 of FIG. 5) may be disposed at a location that is adjacent to the processor 920 (e.g., 420 of FIG. 4), external noise introduced into the processor 920 (e.g., 420 of FIG. 4) or the first and second power transmission lines 902 and 903 (e.g., 502 and 503 of FIG. 5) can be effectively interrupted.

Figure 10:
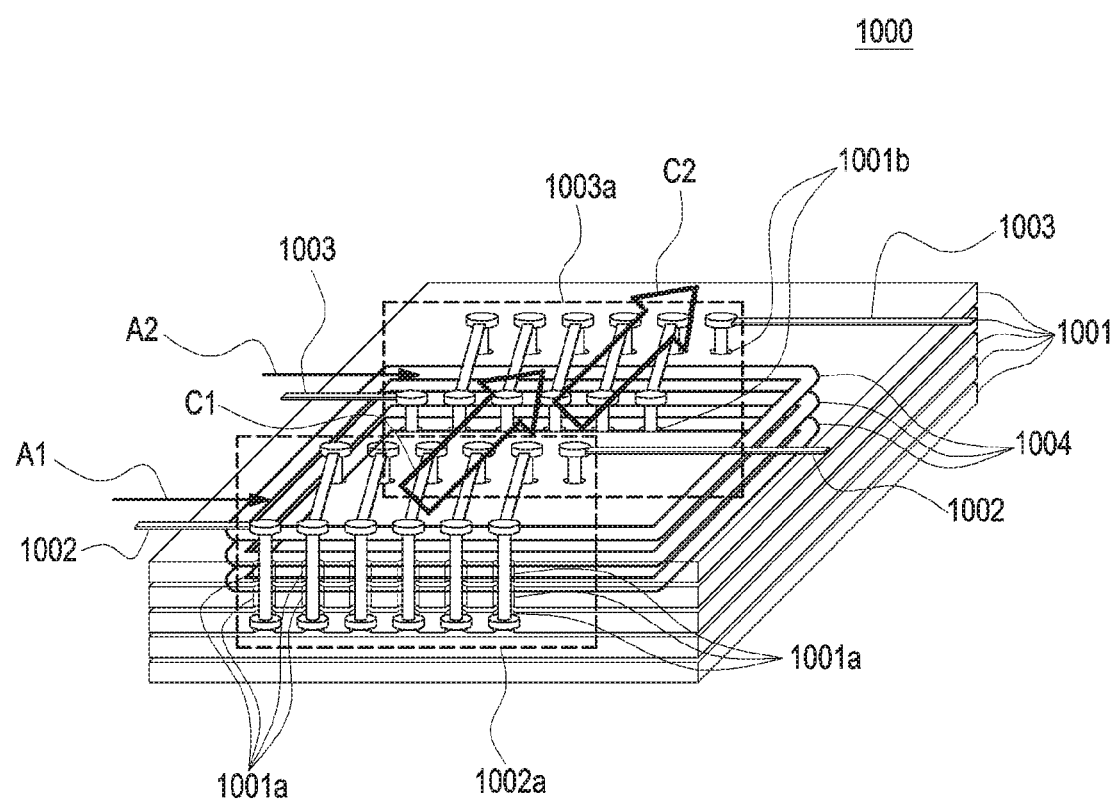
FIG. 10 is a perspective view illustrating a circuit board according to other various embodiments of the disclosure.

FIG. 10 is a perspective view illustrating a circuit board according to various other embodiments of the disclosure.

Referring to FIG. 10, the circuit board 1000 may include a plurality of dielectric layers 1001, a plurality of first and second power transmission lines 1002 and 1003, and a plurality of closed loop patterns 1004.

The plurality of dielectric layers 1001 may have a plurality of first and second pattern holes 1001a and 1001b. For example, if the plurality of dielectric layers 1001 is disposed to be stacked, the plurality of first pattern holes 1001a and 1001b may face each other and the plurality of second pattern holes 1001a and 1001b also may face each other. The plurality of first power transmission lines 1002 may form a plurality of first patterns 1002a while being coupled along the plurality of first pattern holes 1001a, and the second power transmission lines 1003 may form a plurality of second patterns 1003a while being coupled along the plurality of second pattern holes 1001b. The plurality of first and second power transmission lines 1002 and 1003 may form the coil-shaped patterns while being coupled to be wound along the plurality of first and second pattern holes 1001a and 1001b.

The plurality of first and second power transmission lines 1002 and 1003 may be disposed in the circuit board 1000 in parallel at a predetermined interval while being wound in the same direction.

The plurality of closed loop patterns 1004 may be disposed to be wound in the plurality of first and second power transmission lines 1002 and 1003 disposed in a coil-shaped pattern. For example, the plurality of closed loop patterns 1004 may be coupled while passing through the inside of the plurality of first patterns 1002a and the inside of the plurality of second patterns 1003a, and may surround the plurality of first and second power transmission lines 1002 and 1003.

According to an embodiment, the at least one closed loop pattern 1004 may be formed in a ring-shaped coil to surround the insides of the plurality of first and second patterns 1002a and 1003a. For example, the plurality of closed loop patterns 1004 may have a ring-structure in which the plurality of closed loop patterns 1004 is inserted into the entrance of the plurality of first patterns 1002a and is extracted from the exit of the plurality of first patterns 1002a, and then is inserted into the entrance of the plurality of second patterns 1003a and is extracted from the exit of the plurality of second patterns 1003a. Although it has been exemplified that the plurality of closed loop patterns 1004 has a ring-shaped structure, the disclosure is not limited thereto. That is, any ring-shaped structure that may be connected while passing through the insides of the plurality of first and second patterns 1002a and 1003a may be variously applied as the plurality of closed loop patterns

1004. For example, the plurality of closed loop patterns 1004 may include an elliptical structure, a square structure, or a circular structure.

Figure 11:
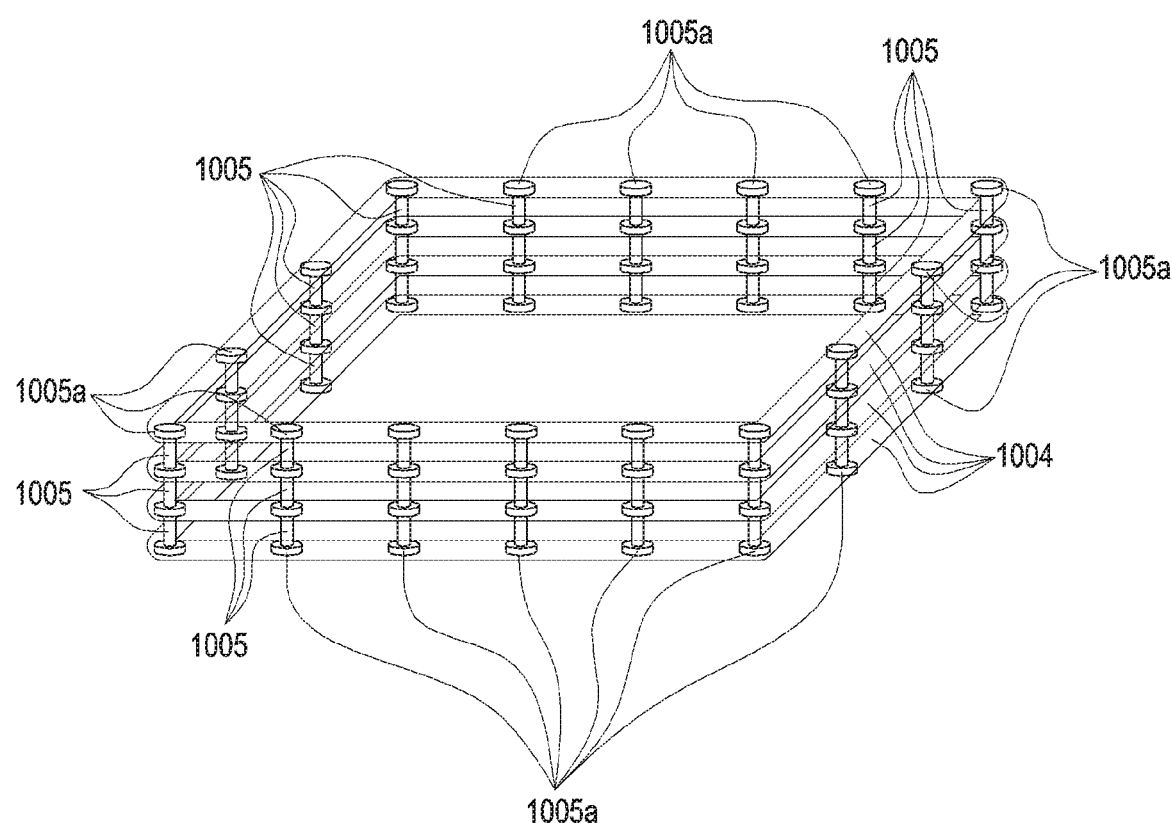
FIG. 11 is a perspective view illustrating a configuration of a circuit board according to other various embodiments of the disclosure.

FIG. 11 is a perspective view illustrating a configuration of a plurality of closed loop patterns 1004, among the components of the circuit board 1000 according to other various embodiments of the disclosure.

Referring to FIG. 11, the plurality of closed loop patterns 1004 may be connected to a plurality of via holes 1005 to form a ring-shaped coil. For example, the plurality of via holes 1005 may be disposed in the plurality of dielectric layers 1001. The plurality of via holes 1005 may include a plurality of support parts to be disposed in the plurality of dielectric layers 1001, and may include a plurality of support parts 1005a that supports and connects the at least one closed loop pattern 1004. The plurality of support parts 1005a may support the plurality of closed loop patterns 1004 such that the plurality of closed loop patterns 1004 is formed in a ring-shaped coil.

According to an embodiment, the plurality of via holes 1005 may be formed in the plurality of dielectric layers 1001, and the plurality of closed loop patterns 1004 may be connected to the plurality of via holes 1005.

As illustrated in FIGS. 10 and 11, a ferrite cylinder may be realized by forming the plurality of closed loop patterns 1004 in the plurality of dielectric layers 1001 and connecting the plurality of closed loop patterns 1004 through the plurality of via holes 1005.

According to an embodiment, when first and second current A1, A2 is applied to the plurality of first and second power transmission lines 1002 and 1003, the current A1 flows along the plurality of first and second patterns 1002a and 1003a of the plurality of first and second power transmission lines 1002 and 1003. When the first and second current A1, A2 flows along the plurality of first and second patterns 1002a and 1003a, magnetic fluxes C1, C2 may be generated in the plurality of first and second patterns 1002a and 1003a.

A ferrite cylinder may be realized by forming the plurality of closed loop patterns 1004 in the plurality of dielectric layers and connecting the plurality of closed loop patterns 1004 through the plurality of via holes 1005.

In this way, because the magnetic flux C1, C2 is formed if the first and second current A1, A2 is applied to the plurality of first and second power transmission lines 1002 and 1003 and the plurality of closed loop patterns 1004 realizes the function of a ferrite cylinder, external noise introduced into the plurality of first and second power transmission lines 1002 and 1003 can be interrupted more effectively.

According to various embodiments, a circuit board may include a plurality of dielectric layers having a plurality of pattern holes, and a plurality of power transmission lines formed in the plurality of dielectric layers, and coupled along the plurality of pattern holes to form a plurality of patterns, and magnetic fluxes may be generated in the plurality of patterns when a current is applied to each of the plurality of power transmission lines.

According to various embodiments, the plurality of patterns may include coil-shaped patterns.

According to various embodiments, the plurality of patterns may be configured to be used as filters that interrupt external noise by the magnetic fluxes when the current is applied to the plurality of power transmission lines.

According to various embodiments, the plurality of dielectric layers may be disposed to be stacked and have a plurality of first pattern holes and a plurality of second pattern holes, the plurality of power transmission lines may include a plurality of first transmission line formed in the plurality of dielectric layers, and coupled along the plurality of first pattern holes to form a plurality of first patterns, and a plurality of second transmission line formed in the plurality of dielectric layers, and coupled along the plurality of second pattern holes to form a plurality of second patterns, and the magnetic fluxes may be generated in the plurality of first and second patterns when the current is applied to each of the plurality of first and second power transmission lines.

According to various embodiments, the plurality of first pattern holes and the plurality of second pattern holes may include a plurality of via holes.

According to various embodiments, the plurality of first and second patterns may include coil-shaped patterns.

According to various embodiments, the plurality of first and second patterns may be configured to be used as filters that interrupt external noise by the magnetic fluxes generated when the current is applied to each of the plurality of first and second power transmission lines, and the filters may be configured to be used in place of a common mode filter.

According to various embodiments, the plurality of first and second power transmission lines may include differential mode signal power transmission lines.

According to various embodiments, the magnetic fluxes may be formed in a direction that is perpendicular to an input direction of the current.

According to various embodiments, the plurality of first and second power transmission lines may be disposed in parallel to each other at a predetermined interval or disposed to be symmetrical to each other.

According to various embodiments, the plurality of first and second power transmission lines may include a plurality of transmission varying parts configured to vary the directions of the power transmission lines, and a plurality of hole passing parts included between the plurality of transmission varying parts and passing through the plurality of first pattern holes and the plurality of second pattern holes.

According to various embodiments, the plurality of first and second power transmission lines may include first, second, and third transmission areas, and an input part for inputting the current may be included in the first transmission area, an output part for outputting the current may be included in the second transmission area, and a flow part for causing the current to flow from the input part to the output part may be included in the third transmission area.

According to various embodiments, the plurality of dielectric layers may further include a plurality of closed loop patterns surrounding the insides of the first patterns and the insides of the second patterns while passing through the first patterns and the second patterns.

According to various embodiments, the plurality of closed loop patterns may include ring-shaped coils.

According to various embodiments, a plurality of via holes may be included in the plurality of dielectric layers to connect the plurality of closed loop patterns, and a plurality of support parts may be included in the plurality of via holes to support the plurality of closed loop patterns while connecting the plurality of closed loop patterns.

According to various embodiments, an electronic device including a circuit board may include a housing including a first surface, a second surface facing an opposite direction of the first surface, and side surfaces surrounding a space between the first surface and the second surface, and a circuit board disposed in the interior of the housing, and the circuit board may include a plurality of dielectric layers disposed to be stacked and having a plurality of first pattern holes and a plurality of second pattern holes, a plurality of first transmission line formed in the plurality of dielectric layers, and coupled along the plurality of first pattern holes to form a plurality of first patterns, and a plurality of second transmission line formed in the plurality of dielectric layers, and coupled along the plurality of second pattern holes to form a plurality of second patterns, and magnetic fluxes may be generated in the plurality of first and second patterns when a current is applied to each of the plurality of first and second power transmission lines.

According to various embodiments, the plurality of first and second patterns may include coil-shaped patterns.

According to various embodiments, the plurality of first and second patterns may be configured to be used as filters that interrupt external noise by magnetic fluxes generated when a current is applied to the plurality of first and second transmission lines.

According to various embodiments, the plurality of dielectric layers may further include plurality of closed loop patterns surrounding the insides of the plurality of first patterns and the insides of the plurality of second patterns while passing through the plurality of first patterns and the second patterns.

It is noted by those skilled in the art to which the disclosure pertains that the circuit board and the electronic device including the same according to various embodiments of the disclosure, which have been described above, are not limited to the above-mentioned embodiments and the drawings, but may be variously replaced, modified, and changed without departing from the scope of the disclosure.

The invention claimed is:

1. A circuit board comprising:
a plurality of stacked dielectric layers having a plurality of first pattern holes and a plurality of second pattern holes;
a plurality of first power transmission lines formed in the plurality of dielectric layers, and coupled along the plurality of first pattern holes to form a plurality of first patterns; and
a plurality of second power transmission lines formed in the plurality of dielectric layers, and coupled along the plurality of second pattern holes to form a plurality of second patterns,
wherein magnetic fluxes are generated in the plurality of first patterns and the plurality of second patterns when a current is applied to each of the plurality of first power transmission lines and the plurality of second power transmission lines,
wherein the plurality of dielectric layers further comprises a plurality of closed loop patterns surrounding insides of the plurality of first patterns and insides of the plurality of second patterns while passing through the plurality of first patterns and the plurality of second patterns, and
wherein the plurality of closed loop patterns comprise ring-shaped coils.

2. The circuit board of claim 1, wherein the plurality of first patterns and the plurality of second patterns comprise coil-shaped patterns.

3. The circuit board of claim 1, wherein the plurality of first patterns and the plurality of second patterns are configured as filters for interrupting external noise by the magnetic fluxes generated when the current is applied to each of the plurality of first power transmission lines and the plurality of second power transmission lines.

4. The circuit board of claim 1, wherein the plurality of first pattern holes and the plurality of second pattern holes comprise a plurality of via holes.

5. The circuit board of claim 1, wherein the plurality of first patterns and the plurality of second patterns are configured as filters for interrupting external noise by the magnetic fluxes generated when the current is applied to each of the plurality of first power transmission lines and the plurality of second power transmission lines, and the filters are configured for use in place of a common mode filter.

6. The circuit board of claim 1, wherein the plurality of first power transmission lines and the plurality of second power transmission lines comprise differential mode signal power transmission lines.

7. The circuit board of claim 1, wherein the magnetic fluxes are generated in a direction perpendicular to an input direction of the current.

8. The circuit board of claim 1, wherein the plurality of first power transmission lines and the plurality of second power transmission lines are disposed in parallel to each other at a predetermined interval or are symmetrically disposed relative to each other.

9. The circuit board of claim 1, wherein the plurality of first power transmission lines and the plurality of second power transmission lines comprise:
a plurality of transmission varying parts configured to vary the directions of the plurality of first power transmission lines and the plurality of second power transmission lines; and
a plurality of hole passing parts included between the plurality of transmission varying parts and passing through the plurality of first pattern holes and the plurality of second pattern holes.

10. The circuit board of claim 1, wherein the plurality of first power transmission lines and the plurality of second power transmission lines comprise first, second, and third transmission areas, and
wherein an input part for inputting the current is included in the first transmission area, an output part for outputting the current is included in the second transmission area, and a flow part for current flow from the input part to the output part is included in the third transmission area.

11. The circuit board of claim 1, wherein a plurality of via holes are included in the plurality of stacked dielectric layers to connect the plurality of closed loop patterns, and
wherein a plurality of support parts are included in the plurality of via holes to support the plurality of closed loop patterns while connecting the plurality of closed loop patterns.

12. An electronic device comprising:
a housing comprising a first surface, a second surface facing an opposite direction of the first surface, and side surfaces surrounding a space between the first surface and the second surface; and
a circuit board disposed in an interior of the housing,
wherein the circuit board comprises:
a plurality of stacked dielectric layers having a plurality of first pattern holes and a plurality of second pattern holes;
a plurality of first power transmission lines formed in the plurality of dielectric layers, and coupled along the plurality of first pattern holes to form a plurality of first patterns; and a plurality of second power transmission lines formed in the plurality of dielectric layers, and coupled along the plurality of second pattern holes to form a plurality of second patterns, and wherein magnetic fluxes are generated in the plurality of first patterns and the plurality of second patterns when a current is applied to each of the plurality of first power transmission lines and the plurality of second power transmission lines, wherein the plurality of dielectric layers further comprises a plurality of closed loop patterns surrounding insides of the plurality of first patterns and insides of the plurality of second patterns while passing through the plurality of first patterns and the plurality of second patterns, and wherein the plurality of closed loop patterns comprise ring-shaped coils.

* * * * *